US012813321B2

(12) United States Patent
Qian et al.

(10) Patent No.: US 12,813,321 B2
(45) Date of Patent: Nov. 24, 2026

(54) PACKAGING METHODS AND PACKAGING APPARATUS

(71) Applicant: Yangtze Memory Technologies Co., Ltd., Wuhan (CN)

(72) Inventors: Weisong Qian, Wuhan (CN); Peng Chen, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 586 days.

(21) Appl. No.: 18/461,308

(22) Filed: Sep. 5, 2023

(65) Prior Publication Data

US 2025/0079191 A1 Mar. 6, 2025

(51) Int. Cl.

*H10W 74/01* (2026.01)
*H10P 72/00* (2026.01)
*H10W 74/10* (2026.01)

(52) U.S. Cl.

CPC ....... *H10W 74/017* (2026.01); *H10P 72/0441* (2026.01); *H10W 74/016* (2026.01); *H10W 74/114* (2026.01)

(58) Field of Classification Search

CPC ............. H10W 74/017; H10W 74/016; H10W 74/114; H10P 72/0441; B29C 33/60; B29C 33/62; B29C 33/68

See application file for complete search history.

(56) References Cited

U.S. PATENT DOCUMENTS

2015/0072139 A1* 3/2015 Morita .................... B29C 33/68 428/338

* cited by examiner

*Primary Examiner* — Jose R Diaz

(74) *Attorney, Agent, or Firm* — Hanley, Flight & Zimmerman, LLC

(57) ABSTRACT

The present disclosure relates to a packaging method and a packaging apparatus. The packaging method includes performing a first packaging operation on a first mold of a packaging apparatus, the first packaging operation including: disposing an isolation layer on the first surface of the first mold; and acquiring, by the first mold, a substrate to be packaged after disposing the isolation layer, wherein the substrate is separated from the first surface of the first mold by the isolation layer; performing a second packaging operation on a second mold of the packaging apparatus, the second packaging operation including: disposing a compound for packaging in the second mold; and closing the first mold and the second mold after completing the first packaging operation and the second packaging operation to form a semiconductor package.

18 Claims, 9 Drawing Sheets

PACKAGING METHODS AND PACKAGING APPARATUS

TECHNICAL FIELD

The present disclosure relates generally to the field of packaging technique, in particular to packaging methods and packaging apparatus.

BACKGROUND

In packaging technology, compression molding process is a packaging and molding process used in the industry. The compression molding process has various advantages, for example, the materials selected in the process, such as resin, have the advantages of high utilization, low flow and suitability for large scale frame plastic packaging.

BRIEF DESCRIPTION OF DRAWINGS

The accompanying drawings, which are incorporated herein and form a part of the specification, illustrate examples of the present disclosure and, together with the specification, further serve to explain the principles of the present disclosure and to enable a person skilled in the pertinent art to make and use the present disclosure.

Figure 1A:
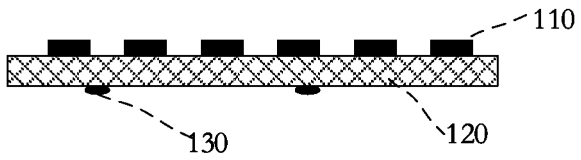
FIG. 1A PRIOR ART
FIG. 1A illustrates a schematic diagram of a substrate to be packaged with foreign particulate matter adhered on the rear side.

The features and advantages of the present disclosure will become more apparent from the detailed description set forth below when taken in conjunction with the drawings, in which like reference numbers identify corresponding elements throughout. In the drawings, like reference numbers indicate identical, functionally similar, and/or structurally similar elements. The drawing in which an element first appears is indicated by the leftmost digit in the corresponding reference number. Examples of the present disclosure will be described with reference to the accompanying drawings.

DETAILED DESCRIPTION

In the process of packaging and molding, the package is made out from the packaging apparatus through the processes of feeding, heating, pressing, mold closing and so on. However, there are still some packaging techniques to be further improved in the packaging and molding process by the packaging apparatus.

Although specific configurations and arrangements are discussed, it should be understood that these are done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one example," "an example," "an illustrative example," "some examples," etc., indicate that the example described can include a particular feature, structure, or characteristic, but every example can not necessarily include the particular feature, structure, or characteristic. Moreover, such phrases do not necessarily refer to the same example. Further, when a particular feature, structure or characteristic is described in connection with an example, it would be within the knowledge of a person skilled in the pertinent art to affect such feature, structure or characteristic in connection with other examples whether or not explicitly described.

Terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

In semiconductor packaging process, a compression molding process may be employed as the packaging and molding process in the packaging apparatus and a substrate to be packaged is molded and packaged with a compound such as resin. In the process of packaging and molding, the packaging apparatus first acquires the substrate to be packaged with the upper mold and a compound for packaging is disposed in the lower mold, and then a semiconductor package is manufactured by the processes of heating, pressing, mold closing and so on.

Nevertheless, in the packaging process of the upper and lower molds of the packaging apparatus, foreign particulate matters or impurities tend to adhere on the mold surface, which, if not removed in time, would cause dent(s) on the substrate surface of continuous packaged product, which in turn results in appearance degradation and functional damage of the packaged product. In a solution, the foreign particulate matters are removed or avoided while separating the mold of the packaging apparatus and the molded product by adding release agent in the material such as resin. However, in practical process, it is impossible to effectively remove all foreign particulate matters, there is still some foreign particulate matters remaining on the mold surface, therefore causing the dent on substrate surface of the packaged product in subsequent production of package.

In the packaging and molding process of a semiconductor package, due to various reasons, some foreign particulate matters or impurities tend to attach on the mold surface of the packaging apparatus. For example, as shown in FIG. 1A, one or more dies 110 are disposed on the front side of the substrate to be packaged 120. However, some particulate matters or impurities 130 might attach on the back side of the substrate 120 due to bad clearing etc.

Figure 1B:
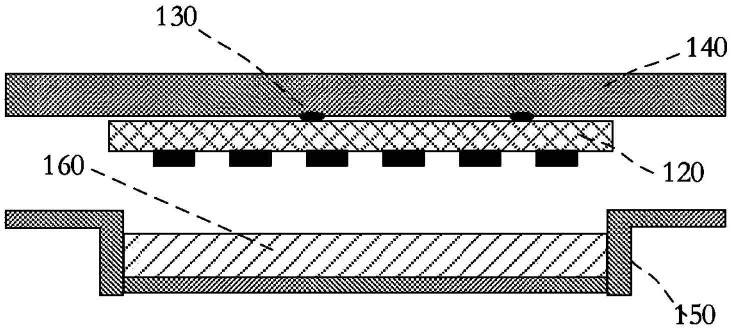
FIG. 1B PRIOR ART
FIG. 1B illustrates a schematic diagram of the upper mold of the packaging apparatus acquiring the substrate attached with foreign particulate matter in the packaging process.

As shown in FIG. 1B, in the process of packaging and molding, after the substrate to be packaged 120 is inverted, the inverted substrate 120 is acquired by the upper mold 140 of the packaging apparatus. The substrate 120 containing the die 110 is compression molded by the upper mold 140 and the lower mold 150 filled with a packaging compound 160 via the processes of heating, pressing, mold closing and so on, so as to form the semiconductor package. As shown in FIG. 1B, in the process of closing the upper mold 140 and the lower mold 150 of the packaging apparatus, due to the presence of foreign particulate matters or impurities 130 and the pressure between the upper mold 140 and the lower mold 150, the foreign particulate matters or impurities 130 would create the dent on the rear surface of the substrate 120, which in turn results in appearance degradation and functional damage of the formed semiconductor package, such as breakage of die 110 or damage of wire on the semiconductor package.

Figure 1C:
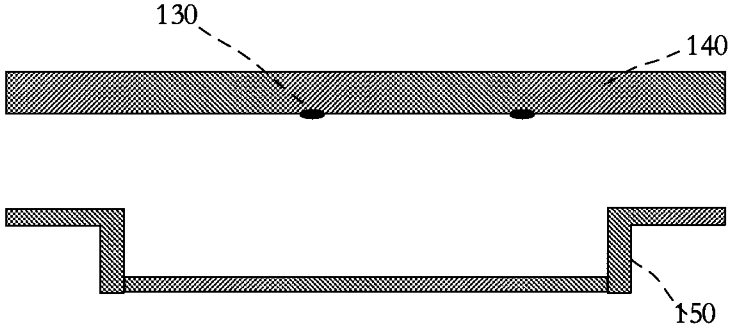
FIG. 1C PRIOR ART
FIG. 1C illustrates a schematic diagram of foreign particulate matter remaining on the upper mold surface of the packaging apparatus after packaging.

Furthermore, as shown in FIG. 1C, after the formed semiconductor package is taken out from the packaging apparatus by opening molds, the foreign particulate matters 130 would still remain on the surface of the upper mold 140 of the packaging apparatus. After the next substrate to be packaged is inverted and acquired by the upper mold 140 of the packaging apparatus, the foreign particulate matters or impurities 130 remaining on the surface of the upper mold 140 would cause the dent on the rear surface of the next substrate regardless of whether there is any particulate matter thereon or not, which in turn results in appearance degradation and functional damage of the subsequently formed semiconductor package.

According to some examples of the present disclosure, there are provided a packaging method and a packaging apparatus for forming a semiconductor package. With the packaging method and packaging apparatus, before molding and packaging each substrate to be packaged, by disposing an isolation layer on the surface of the upper mold of the packaging apparatus, it is possible to separate the substrate to be packaged from the surface of the upper mold, thereby effectively preventing the foreign particulate matters or impurities from damaging the substrate in the process of closing upper and lower molds of the packaging apparatus and ensuring the yield of appearance and functionality of the formed semiconductor package.

Figure 2:
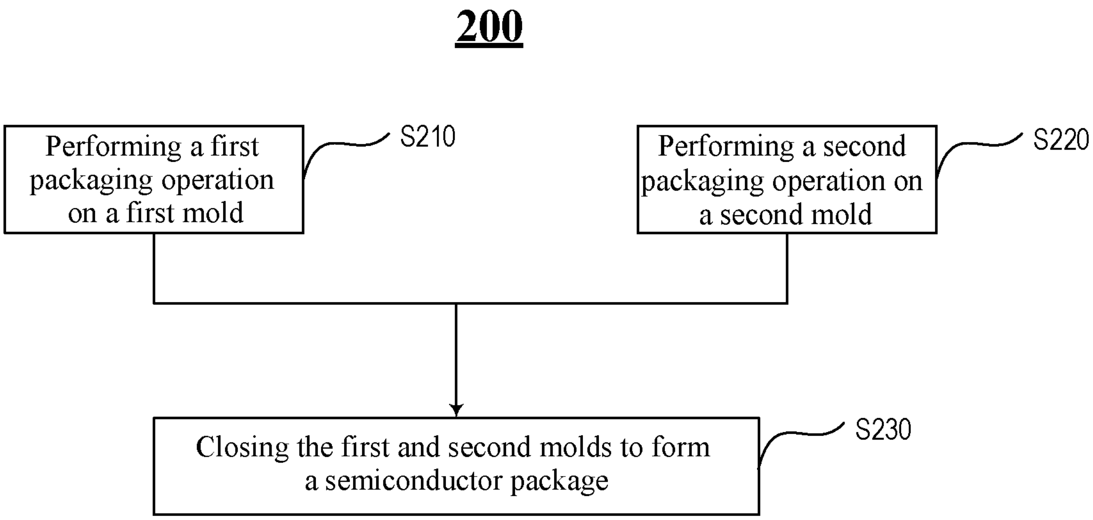
FIG. 2 illustrates a flow diagram of a packaging method for forming a single semiconductor package according to some examples of the present disclosure.
Figure 4:
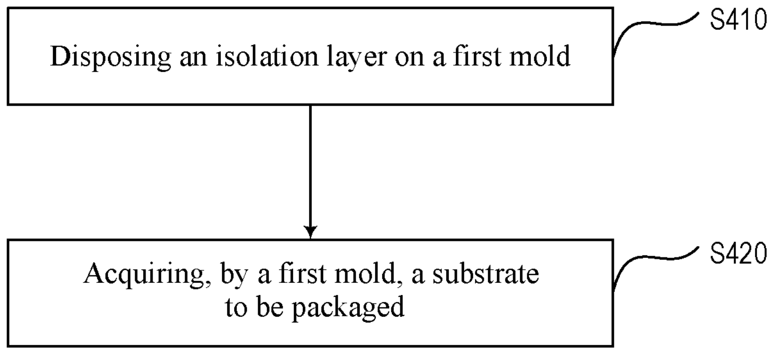
FIG. 4 illustrates a flow diagram of a first packaging operation of a packaging method according to some examples of the present disclosure.
Figure 5:
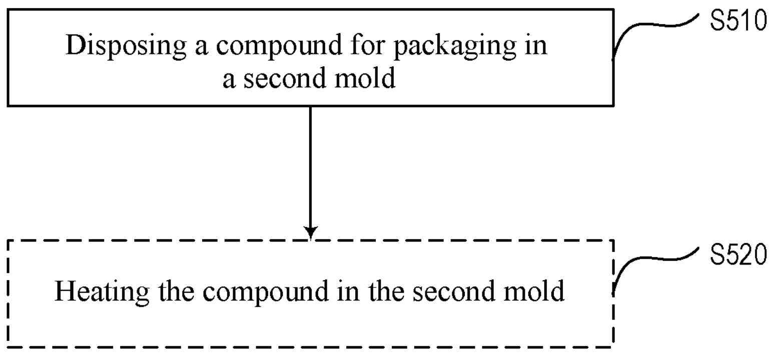
FIG. 5 illustrates a flow diagram of a second packaging operation of a packaging method according to some examples of the present disclosure.
Figure 6:
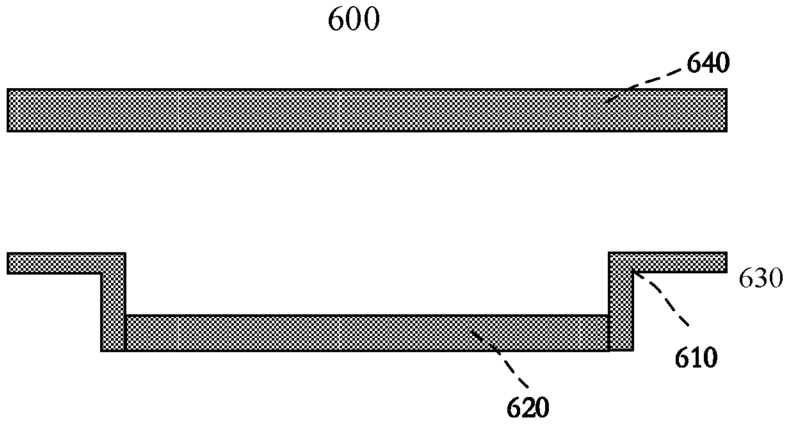
FIG. 6 illustrates a sectional diagram of an example packaging apparatus according to some examples of the present disclosure.
Figure 7:
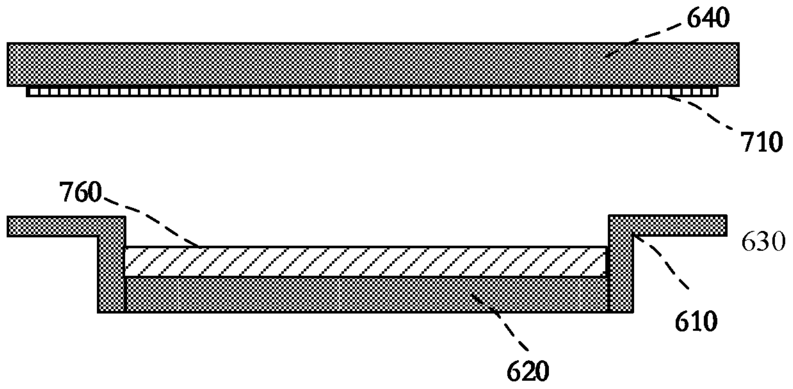
FIGS. 7-9 illustrate a manufacturing process of forming a semiconductor package with the example packaging apparatus according to the present disclosure.
Figure 8:
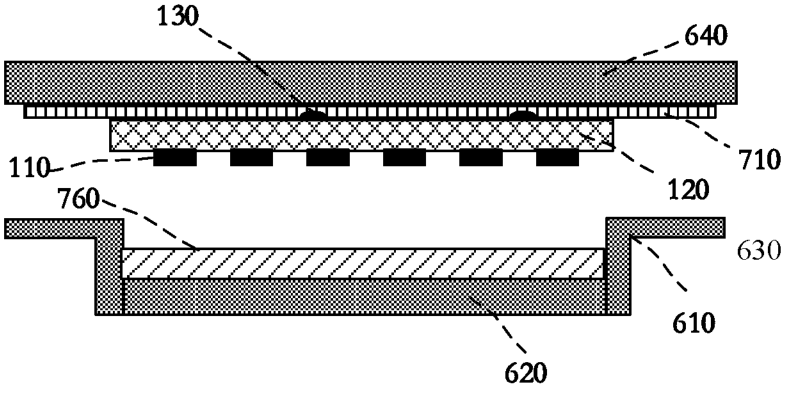
Figure 9:
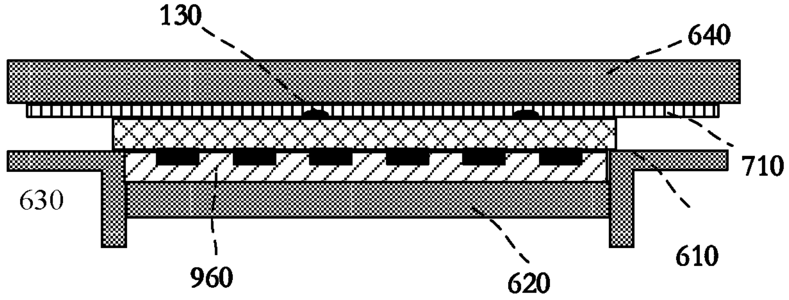

FIG. 2 illustrates a flow diagram of a packaging method 200 for forming a single semiconductor package according to some examples of the present disclosure. FIGS. 4 and 5 illustrate flow diagrams of the first packaging operation S210 and the second packaging operation S220 of the packaging method 200 respectively. FIG. 6 illustrates a sectional diagram of an example packaging apparatus according to some examples of the present disclosure. FIGS. 7-9 illustrate a manufacturing process of forming a semiconductor package with the example packaging method 200 and the packaging apparatus 600 according to the present disclosure. The packaging method 200 and packaging apparatus 600 for forming the semiconductor package according to some examples of the present disclosure will be described in connection with FIGS. 2, and 4-9 below. It should be understood that the operations shown in the packaging method 200 are not exhaustive, and that other operations may be performed before, after or between any of the shown operations. Furthermore, it is possible to perform some of the operations at the same time or in an order different from those shown in FIG. 2.

Referring to FIG. 2, the packaging method 200 starts from the first packaging operation S210 and the second packaging operation S220. The first packaging operation S210 may be configured to perform the package operation on the first mold 640 (upper mold) of the packaging apparatus 600.

As shown in FIG. 6, the example packaging apparatus 600 according to some examples of the present disclosure may include a first mold 640 on the upper side and a second mold 630 on the lower side and opposite to the first mold 640. In some examples, the first mold 640 may be of a plate-like structure. However, it is appreciated that the first mold 640 may be of other structures suitable for substrate shapes based on the shape of the substrate to be packaged. In some examples, the packaging apparatus 600 may include a control and transmission device (not shown) so as to control the first mold 640 to move in horizontal direction and vertical direction, thereby facilitating the first mold 640 to operate in the packaging and molding process. It is appreciated that the implementation of the control and transmission device may be expected and realized by one skilled in the art, and will not be described in detail herein in order not to obscure the present disclosure. Operations on the first mold 640 in the first packaging operation S210 will be further described in detail later in connection with FIGS. 4 and 7.

In some examples, the second mold 630 may include a central baseplate 620 and an external frame 610 around a periphery of the central baseplate. In some examples, the central baseplate 620 mates the external frame 610 closely and sealing structure (not shown) such as sealing pad is disposed at the engagement site, thereby ensuring a compound for packaging, such as thermosetting resin or plastic, would not permeate out while present in powder or liquid form. In some examples, the external frame 610 and the central baseplate 620 may be arranged such that a concave cavity structure is formed inside the second mold 630, and the top of the cavity structure has an open for accepting the compound for packaging. However, it is appreciated that based on the form of the packaging compound, the external frame 610 and the central baseplate 620 may also be arranged in other structure form to adapt to disposition or filling of the packaging compound. In some examples, the above-described control and transmission device of the packaging apparatus 600 may control the second mold 630 to move in horizontal direction and vertical direction, and may further control the central baseplate 620 to move in vertical direction, thereby facilitating the mold closing operation of the second mold 630 in the packaging and molding process. Operations on the second mold 630 in the second packaging operation S220 will be further described in detail later in connection with FIGS. 5 and 8.

In some examples, the first mold 640 and the second mold 630 of the example packaging apparatus 600 may include a rigid material, such that the manufactured semiconductor package may have more even profile and smooth surface. In some examples, in view that the semiconductor packaging apparatus and the packaging method thereof operate in an environment of a certain temperature and pressure, the rigid materials for the first mold 640 and the second mold 630 may include, but not limited to steel-made material resistant to pressure, abrasion and corrosion or other alloy materials exceeding a certain hardness.

With reference to FIG. 4, the first packaging operation S210 starts from operation S410, in which an isolation layer 710 is disposed on the lower surface of the first mold 640 of the packaging apparatus 600, as shown in FIG. 7. In some examples, the isolation layer 710 may be disposed on the lower surface of the first mold 640 of the packaging apparatus 600 by adhering or attaching. In some examples, as discussed before, some particulate matters or impurities might attach on the rear surface of the substrate to be packaged, in order to more effectively prevent these foreign particulate matters from damaging the rear surface of the substrate to be packaged in the mold closing process of the packaging apparatus 600, the isolation layer 710 may be of a film structure with a certain softness. Based on the factors such as substrate hardness, appearance flatness, the softness of the film structure of the isolation layer 710 may be for example between 120-300 mN, and in some examples, between 150-240 mN (for example, 150 mN, 160 mN, 170 mN, 180 mN, 190 mN, 200 mN, 210 mN, 220 mN, 230 mN or 240 mN).

In some examples, the isolation layer 710 may be of a film structure with a certain thickness so that it is possible to more effectively prevent the foreign particulate matters from damaging the rear surface of the substrate being packaged. In connection with the factors such as softness and cost of the film structure, the thickness of film structure may be for example between 50-100 μm, and in some examples, between 70-100 μm (for example, 70 μm, 75 μm, 80 μm, 85 μm, 90 μm, 95 μm, 100 μm).

Furthermore, considering that the semiconductor packaging apparatus and the packaging method thereof operate in an environment of a high temperature and high pressure, the isolation layer 710 may further have characteristics such as high-temperature resistance and deformation resistance to better adapt to its working environments. In addition, the isolation layer 710 may further have a easy strippability to facilitate removing the isolation layer from the mold surface of the packaging apparatus after completing each semiconductor package so as to remove the foreign particulate matters. In some examples, in view of the softness, high temperature resistance, deformation resistance, easy strippability and low cost of the isolation layer, the isolation layer 710 may include the compound such as resin material, including, but not limited to for example phenolic resin, polyurethane, polyester resin, polyether resin or acrylic resin, etc.

With reference to FIG. 4, after disposing the isolation layer 710 on the lower surface of the first mold 640, the first packaging operation S210 proceeds to S420, in which the first mold 640 of the packaging apparatus 600 acquires the substrate 120 to be packaged. Since an isolation layer 710 is disposed on the lower surface of the first mold 640, the substrate 120 is separated from the lower surface of the first mold by the isolation layer 710, as shown in FIG. 8. In some examples, the packaging apparatus 600 may include a holding device (not shown) such as a clamp or a robotic arm, and can hold or attach the substrate to be packaged 120 on the surface of the isolation layer 710 with the holding device.

In some examples, the substrate to be packaged 120 may include a first surface and a second surface opposite to the first surface and at least one die 110 is disposed on the first surface (front side) of the substrate 120. Furthermore, as discussed before, a plurality of foreign particulate matters 130 might be adhered on the second surface (rear surface) of the substrate 120. In some examples, while the first mold 640 of the packaging apparatus 600 acquires the substrate to be packaged 120, the substrate 120 will be inverted such that the second surface of the substrate 120 contacts and is covered by the isolation layer 710, and the first surface of the substrate 120 on which the die is disposed faces the second mold 630 (as shown in FIG. 8). As a result, the die 110 and the first surface of the substrate 120 on which the die is disposed are encapsulated in the molded body in the process of closing upper and lower molds, thereby forming the semiconductor package.

Returning to FIG. 2, the second packaging operation S220 may be configured to perform the package operation on the second mold 630 (lower mold) of the packaging apparatus 600. Referring to FIG. 5, the second packaging operation S220 starts from operation S510, in which the compound 760 for packaging is disposed in the second mold 630 of the packaging apparatus 600. In some examples, as discussed above, the second mold 630 may include a cavity structure formed by an external frame 610 and a central baseplate 620 and the packaging compound 760 may be filled in the cavity structure of the second mold 630, as shown in FIG. 7. In some examples, the packaging compound 760 may include the thermosetting resin (such as epoxy resin, phenolic or furan resin, etc.) or plastic, etc. However, it can be understood that the materials for the packaging compound are not limited thereto in the present disclosure, other molding materials suitable for semiconductor package may also be selected, such as non-thermosettable resin, or other materials that may be cured by an additive or other methods.

Referring to FIG. 5, after disposing the packaging compound 760 in the second mold 630 and if the packaging compound 760 is the thermosetting resin material, the second packaging operation S220 may proceed to S520, in which the packaging compound 760 in the cavity of the second mold 630 is heated to a predetermined temperature to soften it, thereby facilitating the next mold closing operation of the packaging method 200. In some examples, the packaging apparatus 600 may include a heating device (not shown) such as resistive or electromagnetic ones and the second mold 630 may be heated with the heating device to soften the thermosetting resin material in the second mold 630. Furthermore, it is appreciated that the temperature required to soften the thermosetting resin material is not the same depending on the different thermosetting resin materials, and thus the predetermined temperature required for softening may be set based on the selected thermosetting resin material. For example, when the thermosetting resin material is an epoxy material, the heating temperature is between for example, 80-160° C., in some examples between 100-140° C.

Although the first packaging operation S210 and the second packaging operation S220 are described sequentially in the present disclosure, it is appreciated that the first packaging operation S210 and the second packaging operation S220 may be performed in the same period or at the same time, it is also possible to perform the second packaging operation S220 first and then the first packaging operation S210, or vice versa.

Returning to FIG. 2, the packaging method 200 may proceed to the mold closing operation S230, in which the first mold 640 and the second mold 630 of the packaging apparatus 600 are closed to form a semiconductor package 960. In some examples, the first mold 640 and the second mold 630 may be closed under a certain pressure and temperature with the compression forming method, the softened packaging compound encapsulates the die 110 and the first surface of the substrate 120 on which the die is disposed. After a period of time, the packaging compound is cooled and cured, forming the molded body, thereby completing the fabrication of the semiconductor package 960, as shown in FIG. 9.

As discussed above, the packaging apparatus 600 operates under a certain pressure and temperature in the mold closing process of manufacturing the semiconductor package, and the molds is opened to take out the completed semiconductor package after a certain period of time. Depending on the different types and requirements of the semiconductor packages and the packaging compounds, the desired temperature, pressure and duration in the mold closing process will be different. It is appreciated that the above-described process conditions used in the mold closing process may be expected and realized by one skilled in the art, and will not be described in detail herein in order not to obscure the present disclosure.

Figure 3:
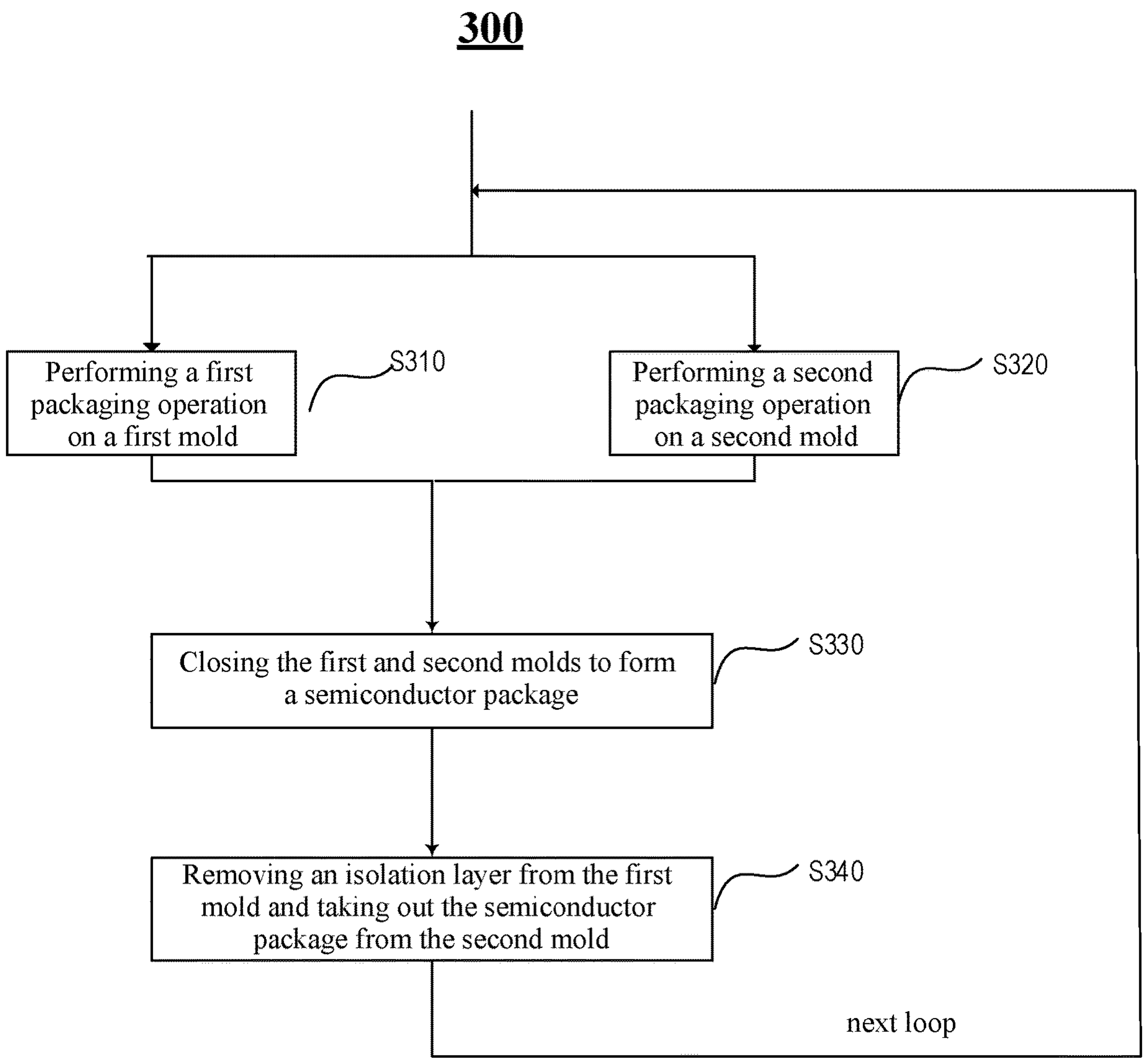
FIG. 3 illustrates a flow diagram of a packaging method for sequentially forming a plurality of semiconductor packages according to some examples of the present disclosure.

Next, a packaging method 300 for continuously forming a plurality of semiconductor packages according to some examples of the present disclosure will be described with reference to FIG. 3. The first packaging operation S310, the second packaging operation S320 and the mold closing operation S330 in the packaging method 300 are the same as the first packaging operation S210, the second packaging operation S220 and the mold closing operation S230 in the packaging method 200, and will not be repeated herein for conciseness and clarity of the present disclosure.

The packaging method 300 is different from the packaging method 200 in that after closing the first mold and the second mold to form the semiconductor package, the packaging method 300 proceeds to the removing and taking-out operation S340, in which after opening the upper and lower molds of the packaging apparatus, the completed semiconductor package is taken out from the second mold 630 and the isolation layer is removed from the lower surface of the first mold 640. It is appreciated that taking out the semiconductor package from the second mold and removing the isolation layer from the lower surface of the first mold may be performed in the same time period or at the same time, or performed sequentially. After taking out the semiconductor package and removing the isolation layer, the packaging method 300 returns back to the starting point, entering the next loop to manufacture the next semiconductor package.

In the above-described examples of the present disclosure, since the softness of the isolation layer 710 is greater than that of the first mold 640 and the rear surface of the substrate to be packaged, namely the isolation layer 710 is softer than the first mold 640 and the rear surface of the substrate to be packaged, while performing the mold closing operation, the foreign particulate matter 130 would sink towards the isolation layer 710, as shown in FIG. 9, thereby avoiding the formation of the dent in the rear surface of the substrate 120 as shown in FIG. 1B. Therefore, by disposing an isolation layer 710 with a certain softness and thickness on the surface of the first mold 640 of the packaging apparatus 600, the surface of the substrate to be packaged on which the particulate matters attach is separated from the surface of the first mold, thereby effectively preventing the foreign particulate matters or impurities from damaging the substrate to be packaged in the process of closing the upper and lower molds of the packaging apparatus.

Furthermore, since the isolation layer 710 has characteristics such as high temperature resistance and deformation resistance, it is ensured that the isolation layer 710 can effectively protect the substrate to be packaged even under a certain temperature and pressure in the mold closing process; and since the isolation layer 710 has characteristics of easy strippability and low cost, it is ensured that a new isolation layer may be provided for each semiconductor package for effective protection for each substrate to be packaged.

Figure 10:
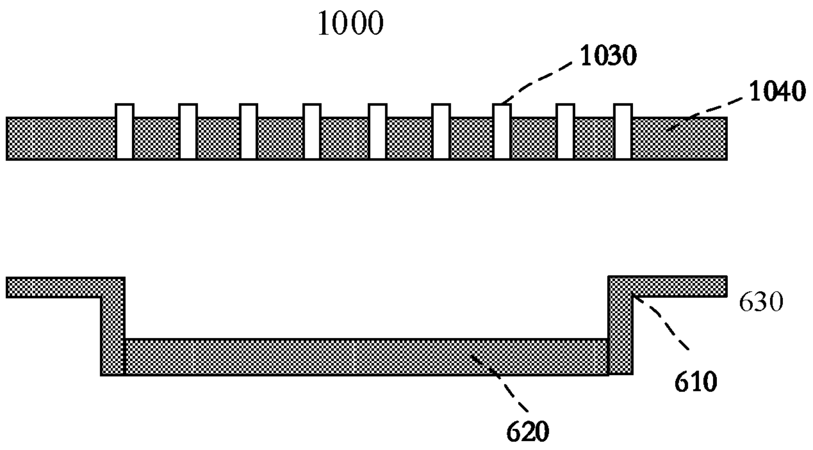
FIG. 10 illustrates a sectional diagram of another example packaging apparatus according to some examples of the present disclosure.

Next, another example packaging apparatus 1000 according to some examples of the present disclosure will be described with reference to FIG. 10. The second mold 630, the control and transmission device and the heating device (not shown) contained in the packaging apparatus 1000 are the same as the second mold 630, the above-described control and transmission device and the heating device contained in the packaging apparatus 600. Same components in the packaging apparatus 1000 will not be described again herein for conciseness and clarity of the present disclosure.

The packaging apparatus 1000 is different from the packaging apparatus 600 in that a plurality of vents 1030 may be disposed in the first mold 1040 of the packaging apparatus 1000. In some examples, the plurality of vents 1030 may be disposed in the first mold 1040 evenly, and each vent 1030 may penetrate from the first surface of the first mold 1040 to the second surface opposite to the first surface of the first mold 1040 for vacuum absorption of the isolation layer and the substrate to be packaged in the packaging process, which will be described in detail below with reference to FIGS. 11-12.

Figure 11:
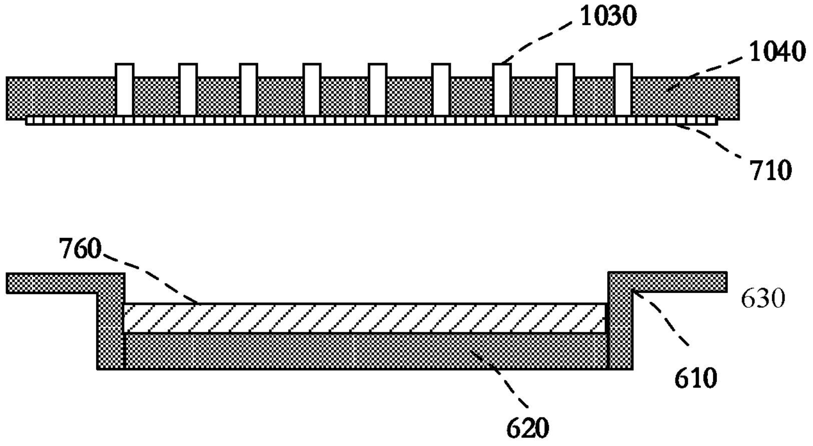
FIGS. 11-13 illustrate a manufacturing process of forming a semiconductor package with the another example packaging apparatus according to the present disclosure.
Figure 12:
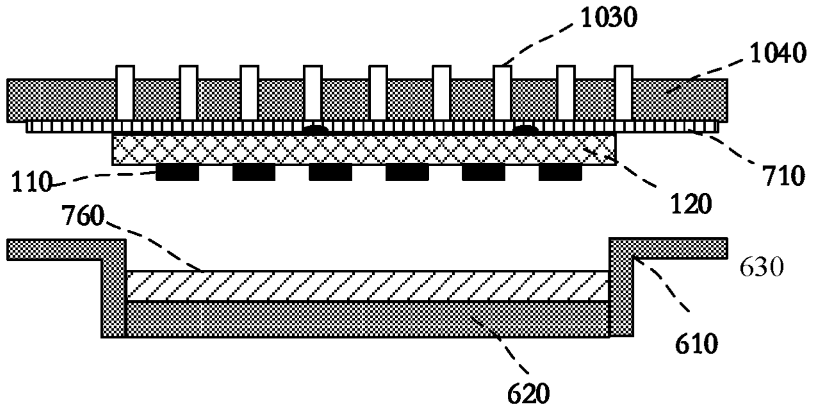
Figure 13:
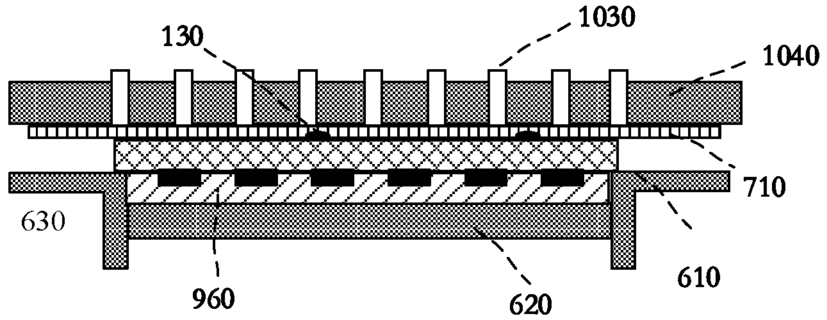

FIGS. 11-13 illustrate a manufacturing process of forming a semiconductor package with the packaging method 200 and the packaging apparatus 1000 according to the present disclosure. In the manufacturing processes of the semiconductor package, the operations of the packaging method 200 as described before equally apply to the packaging apparatus 1000. The operations same as those described before will not be described again for conciseness and clarity of the present disclosure.

In some examples, as compared to the manufacturing process performed by the packaging apparatus 600, in the manufacturing process performed by the packaging apparatus 1000, the first packaging operation S210 may be configured to perform the package operation on the first mold 1040 (upper mold) of the packaging apparatus 1000, and at the operation S410 of the first packaging operation S210, an isolation layer 710 is disposed on the lower surface of the first mold 1040 of the packaging apparatus 1000, as shown in FIG. 11. In some examples, the packaging apparatus 1000 may be provided with a vacuumizing device (not shown) such as a vacuum pump. Since the plurality of vents 1030 are disposed in the first mold 1040 of the packaging apparatus 1000, it is possible to absorb the isolation layer 710 onto the lower surface of the first mold 1040 of the packaging apparatus 1000 by vacuum absorption with the vacuumizing device and the vents 1030.

In some examples, the isolation layer 710 may be of a film structure with gas permeability to satisfy vacuum absorption requirement for the substrate to be packaged in the next operation. In some examples, in view of the gas permeability of the isolation layer 710 for the vacuum absorption of the substrate, the thickness of the film structure may be between for example 50-100 μm, and in some examples between 50-80 μm (e.g., 50 μm, 55 μm, 60 μm, 65 μm, 70 μm, 75 μm, and 80 μm).

In some examples, at the operation S420 of the first packaging operation S210, the first mold 1040 of the packaging apparatus 1000 acquires the substrate 120 to be packaged by vacuum absorption. As discussed above, since the isolation layer 710 has gas permeability, the first mold 1040 can absorb the substrate 120 to be packaged by vacuum through the isolation layer 710 with the vacuumizing device and vents 1030. Since the isolation layer 710 is disposed on the lower surface of the first mold 1040, the substrate 120 is separated from the lower surface of the first mold by the isolation layer 710 as shown in FIG. 12.

FIG. 13 illustrates a manufacturing process of closing the first mold 1040 and the second mold 630 to form a semiconductor package according to some examples of the present disclosure. Similarly to what have been described above with reference to FIG. 9, the first mold 1040 and the second mold 630 may be closed under a certain pressure and temperature with the compression forming method, the softened packaging compound encapsulates the die 110 and the first surface of the substrate 120 on which the die is disposed. After a period of time, the packaging compound is cooled and cured, forming the molded body, thereby completing the fabrication of the semiconductor package 960. It is appreciated that in the manufacturing process implemented with the packaging apparatus 1000 in the packaging method 200, since the second mold 630, the control and transmission device and the heating device of the packaging apparatus 1000 are the same as those contained in the packaging apparatus 600, the second operation S220 implemented with the second mold of the packaging apparatus 1000, and the mold closing operation S230 of the first and second molds in the packaging method 200 are the same as those implemented with the packaging apparatus 600 and will not be described again herein for conciseness and clarity of the present disclosure.

In the examples of the present disclosure described above in connection with FIGS. 10-13, the isolation layer and the substrate to be packaged are absorbed by vacuum via the vents 1030 disposed in the first mold 1040 and the vacuumizing device, which enables easier absorption of the isolation layer evenly onto the surface of the mold and easier removing and releasing of isolation layer from the mold surface after completing the fabrication of an individual semiconductor package, thereby effectively saving packaging time, simplifying process and reducing costs.

The foregoing description of the examples will so fully reveal the general nature of the present disclosure that others can, by applying knowledge within the skill of the art, readily modify and/or adapt, for various applications, such examples, without undue experimentation, and without departing from the general concept of the present disclosure. Therefore, such adaptations and modifications are intended to be within the meaning and range of equivalents of the disclosed examples, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Examples of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Examples of a packaging method, a packaging apparatus and a semiconductor package are described in the present disclosure.

According to an aspect of the disclosure, there is provided a packaging method including: performing a first packaging operation on a first mold of a packaging apparatus, the first packaging operation comprising: disposing an isolation layer on a first surface of the first mold; and acquiring, by the first mold, a substrate to be packaged after disposing the isolation layer, wherein the substrate is separated from the first surface of the first mold by the isolation layer; and performing a second packaging operation on a second mold of the packaging apparatus, the second packaging operation comprising: disposing a compound for packaging in the second mold; and closing the first mold and the second mold after completing the first packaging operation and the second packaging operation to form a semiconductor package.

In some examples, the first packaging operation and the second packaging operation are performed in a same time period.

In some examples, the substrate comprises a first surface and a second surface opposite to the first surface and at least one die is disposed on the first surface of the substrate; and while the first mold acquires the substrate to be packaged, a second surface of the substrate is made contact with and covered by the isolation layer and the first surface of the substrate on which the at least one die is disposed is made facing the second mold.

In some examples, the isolation layer is a film structure with a softness between 150-240 mN.

In some examples, the first mold comprises vents that penetrate from the first surface of the first mold to a second surface of the first mold opposite to the first surface for vacuum absorption.

In some examples, disposing the isolation layer on the first surface of the first mold comprises absorbing the isolation layer onto the first surface of the first mold via the vents with a vacuumizing device.

In some examples, the isolation layer has gas permeability; and acquiring, by the first mold, the substrate to be packaged comprises absorbing the substrate onto a surface of the isolation layer via the vents with the vacuumizing device.

In some examples, the isolation layer has a thickness between 50-100 μm.

In some examples, the compound for packaging comprises at least one of a thermosetting resin or a plastic.

In some examples, the second mold comprises a cavity, and the compound is disposed in the cavity of the second mold; and the second packaging operation further comprises heating the compound in the cavity of the second mold to a predetermined temperature.

In some examples, the first mold and the second mold are closed by a compression molding method and the compound is cooled and cured to form the semiconductor package.

In some examples, the packaging method further comprises: after forming the semiconductor package, taking out the semiconductor package from the second mold and removing the isolation layer from the first mold.

According to another aspect of the disclosure, there is provided a packaging apparatus including: a first mold having a plate-like structure and configured to dispose an isolation layer and a substrate to be packaged in turn on a first surface of the first mold in the packaging process, wherein the substrate is separated from the first surface of the first mold by the isolation layer; and a second mold comprising a central baseplate and an external frame around a periphery of the central baseplate.

In some examples, the first mold is horizontally movable, and the external frame and the central baseplate are arranged such that a concave cavity structure is formed inside the second mold, the cavity structure has an opening on its top and has a closed structure at its bottom and sides.

In some examples, the isolation layer is a film structure with a softness between 150-240 mN.

In some examples, the first mold comprises vents that penetrate from the first surface of the first mold to a second surface of the first mold opposite to the first surface.

In some examples, the packaging apparatus further comprises a vacuumizing device, wherein the first mold is configured to absorb the isolation layer onto the first surface of the first mold via the vents with the vacuumizing device.

In some examples, the isolation layer has gas permeability; and the first mold is configured to absorb the substrate onto a surface of the isolation layer via the vents with the vacuumizing device.

In some examples, the isolation layer has a thickness between 50-100 μm.

According to another aspect of the disclosure, there is provided a semiconductor package manufactured with the above-described packaging method, the semiconductor package comprising: a substrate; at least one die installed on a first surface of the substrate; and a molded body encapsulating the at least one die and at least the first surface of the substrate.

Those skilled in the art may understand other aspects of the present disclosure according to the specification, the claims and the accompanying drawings of the present disclosure.

The Abstract section can set forth one or more but not all examples of the present disclosure as contemplated by the inventor(s), and thus, are not intended to limit the present disclosure and the appended claims in any way.

The breadth and scope of the present disclosure should not be limited by any of the above-described examples, but should be defined only in accordance with the following claims and their equivalents.

What is claimed is:

1. A packaging method comprising:

performing a first packaging operation on a first mold of a packaging apparatus, the first packaging operation comprising:

disposing an isolation layer on a first surface of the first mold, wherein the isolation layer is a film structure with a softness between 150-240 mN; and acquiring a substrate to be packaged by the first mold after disposing the isolation layer, wherein the substrate is separated from the first surface of the first mold by the isolation layer;

performing a second packaging operation on a second mold of the packaging apparatus, the second packaging operation comprising: disposing a compound for packaging in the second mold; and closing the first mold and the second mold after completing the first packaging operation and the second packaging operation to form a semiconductor package.

2. The packaging method of claim 1, wherein the first packaging operation and the second packaging operation are performed in a same time period.

3. The packaging method of claim 1, wherein:

the substrate comprises a first surface and a second surface opposite to the first surface and at least one die is disposed on the first surface of the substrate; and while the first mold acquires the substrate to be packaged, the second surface of the substrate is made contact with and covered by the isolation layer and the first surface of the substrate on which the at least one die is disposed is made facing the second mold.

4. The packaging method of claim 1, wherein the first mold comprises vents that penetrate from the first surface of the first mold to a second surface of the first mold opposite to the first surface for vacuum absorption.

5. The packaging method of claim 4, wherein disposing the isolation layer on the first surface of the first mold comprises absorbing the isolation layer onto the first surface of the first mold via the vents with a vacuumizing device.

6. The packaging method of claim 5, wherein:
the isolation layer has gas permeability; and
acquiring the substrate to be packaged by the first mold includes absorbing the substrate onto a surface of the isolation layer via the vents with the vacuumizing device.

7. The packaging method of claim 1, wherein the isolation layer has a thickness between 50-100 μm.

8. The packaging method of claim 1, wherein the compound for packaging comprises at least one of a thermosetting resin or a plastic.

9. The packaging method of claim 8, wherein:
the second mold comprises a cavity, and the compound is disposed in the cavity of the second mold; and
the second packaging operation further comprises heating the compound in the cavity of the second mold to a predetermined temperature.

10. The packaging method of claim 9, wherein the first mold and the second mold are closed by a compression molding method and the compound is cooled and cured to form the semiconductor package.

11. The packaging method of claim 1, further comprising: after forming the semiconductor package, taking out the semiconductor package from the second mold and removing the isolation layer from the first mold.

12. A packaging apparatus comprising:
a first mold having a plate-like structure and configured to dispose an isolation layer and a substrate to be packaged in turn on a first surface of the first mold in a packaging process, wherein the substrate is separated from the first surface of the first mold by the isolation layer, wherein the isolation layer is a film structure with a softness between 150-240 mN; and
a second mold comprising a central baseplate and an external frame around a periphery of the central baseplate.

13. The packaging apparatus of claim 12, wherein:
the first mold is horizontally movable, and
the external frame and the central baseplate are arranged such that a concave cavity structure is formed inside the second mold, the cavity structure has an opening on its top and has a closed structure at its bottom and sides.

14. The packaging apparatus of claim 12, wherein the first mold comprises vents that penetrate from the first surface of the first mold to a second surface of the first mold opposite to the first surface.

15. The packaging apparatus of claim 14, further comprising a vacuumizing device,
wherein the first mold is configured to absorb the isolation layer onto the first surface of the first mold via the vents with the vacuumizing device.

16. The packaging apparatus of claim 15, wherein:
the isolation layer has gas permeability; and
the first mold is configured to absorb the substrate onto a surface of the isolation layer via the vents with the vacuumizing device.

17. The packaging apparatus of claim 12, wherein the isolation layer has a thickness between 50-100 μm.

18. A fabrication method of a semiconductor, the method comprising:
providing a substrate, wherein at least one die is installed on a first surface of the substrate;
performing a first packaging operation on a first mold of a packaging apparatus, the first packaging operation including:
disposing an isolation layer on a first surface of the first mold, wherein the isolation layer is a film structure with a softness between 150-240 mN; and
acquiring the substrate to be packaged by the first mold after disposing the isolation layer, wherein the substrate is separated from the first surface of the first mold by the isolation layer;
performing a second packaging operation on a second mold of the packaging apparatus, the second packaging operation including: disposing a compound for packaging in the second mold; and
closing the first mold and the second mold after completing the first packaging operation and the second packaging operation to form a semiconductor package.

* * * * *